(12) United States Patent
Birkmire et al.

(10) Patent No.: US 8,450,141 B2
(45) Date of Patent: May 28, 2013

(54) PROCESSES FOR FABRICATING ALL-BACK-CONTACT HETEROJUNCTION PHOTOVOLTAIC CELLS

(75) Inventors: Robert W. Birkmire, Newark, DE (US); Steven S. Hegedus, Newark, DE (US); Ujjwal K. Das, Bear, DE (US)

(73) Assignee: University of Delaware, Newark, DE (US)

( * ) Notice: Subject to any disclaimer, the term of this patent is extended or adjusted under 35 U.S.C. 154(b) by 405 days.

(21) Appl. No.: 12/817,705

(22) Filed: Jun. 17, 2010

(65) Prior Publication Data

US 2010/0319769 A1 Dec. 23, 2010

Related U.S. Application Data

(60) Provisional application No. 61/187,812, filed on Jun. 17, 2009.

(51) Int. Cl.
*H01L 21/00* (2006.01)

(52) U.S. Cl.
USPC .............................. 438/98; 136/256; 257/459

(58) Field of Classification Search
USPC .......................................................... 438/98
See application file for complete search history.

(56) References Cited

U.S. PATENT DOCUMENTS

| | | | | |
|---|---|---|---|---|
| 7,199,395 B2* | 4/2007 | Terakawa et al. | ............... | 257/52 |
| 7,718,888 B2* | 5/2010 | Cousins | ......................... | 136/243 |
| 7,737,357 B2* | 6/2010 | Cousins | ......................... | 136/261 |
| 7,883,343 B1* | 2/2011 | Mulligan et al. | ................. | 439/98 |
| 7,897,867 B1* | 3/2011 | Mulligan et al. | ............... | 136/256 |
| 2010/0084009 A1* | 4/2010 | Carlson et al. | ................. | 136/255 |
| 2010/0136768 A1* | 6/2010 | Biro et al. | ...................... | 438/471 |
| 2010/0319769 A1* | 12/2010 | Birkmire et al. | ............... | 136/256 |

FOREIGN PATENT DOCUMENTS

WO WO 2006/135443 A2 12/2006

OTHER PUBLICATIONS

Glunz, S. W.; New Concepts for High-Efficiency Silicon Solar Cells, Solar Energy Materials & Solar Cells vol. 90; Aug. 14, 2006; pp. 3276-3284; Elsevier B.V.

M. Tucci et al., Laser Fired Back Contact for Silicon Solar Cells; Thin Solid Films 516 (2008); pp. 6767-6770; Elsevier B. V.

E. Schneiderlochner et al.; Laser-Fired Rear Contacts for Crystalline Silicon Solar Cells; Progress in Photovoltaics: Research and Applications vol. 10; (2002); pp. 29-34; John Wiley & Sons, Ltd.

* cited by examiner

*Primary Examiner* — David Vu
*Assistant Examiner* — Earl Taylor
(74) *Attorney, Agent, or Firm* — RatnerPrestia

(57) ABSTRACT

Processes for fabricating back contacts for photovoltaic cell devices are disclosed. The processes involve depositing a passivation layer on the back surface of a wafer, depositing an emitter layer on the passivation layer, depositing a metal layer on the emitter layer, laser firing selected areas of the metal layer to form base contacts, laser cutting the metal layer to create at least one isolation region between emitter contacts and base contacts, and applying a stream of reactive gas to form a second passivation layer in the isolation region. The process may further involve inkjetting a resist on the passivation layer in a pattern corresponding to a boundary between the one or more emitter contacts and the one or more base contacts, and laser cutting the metal layer over the resist to create the isolation region.

11 Claims, 4 Drawing Sheets

PROCESSES FOR FABRICATING ALL-BACK-CONTACT HETEROJUNCTION PHOTOVOLTAIC CELLS

CROSS REFERENCE TO RELATED APPLICATIONS

This application claims the benefit of provisional U.S. patent application No. 61/187,812, filed Jun. 17, 2009, which is fully incorporated herein by reference.

FIELD OF THE INVENTION

The present invention relates to photovoltaic cells, and more particularly, to all-back-contact heterojunction photovoltaic cells.

BACKGROUND OF THE INVENTION

Photovoltaic cells convert light energy into electricity using the photovoltaic effect. Photovoltaic cells that have electrical contacts on only their back surface (all-back-contact photovoltaic cells) may provide advantages over photovoltaic cells having contacts on their front surface. For example, all-back-contact photovoltaic cells avoid problems that occur in front-contact photovoltaic cells such as shading loss from contacts and relatively higher series resistance due to the trade-off between contact resistance and reflectance. However, conventional processes for fabricating all-back-contact photovoltaic cells, such as photolithography, may be complex and risk damaging the photovoltaic cell material with high temperatures. Accordingly, new processes for fabricating all-back-contact photovoltaic cells are desirable.

SUMMARY OF THE INVENTION

The present invention is embodied in processes for fabricating photovoltaic cell devices.

In accordance with one aspect of the present invention, a process for fabricating back contacts for a photovoltaic cell device is disclosed. The device comprises a wafer having a back surface, one or more emitter regions, one or more emitter contacts, and one or more base contacts. The process comprises the steps of depositing a first passivation layer on the back surface of the wafer, depositing an n-type or p-type emitter layer on the passivation layer, the emitter layer comprising the one or more emitter regions, depositing a metal layer on the emitter layer, laser firing selected areas of the metal layer to form the one or more base contacts, laser cutting the metal layer to pattern the metal layer and create at least one isolation region between the one or more emitter contacts and the one or more base contacts, and applying a stream of reactive gas to form a second passivation layer in the isolation region while laser cutting the metal layer.

In accordance with another aspect of the present invention, a process for fabricating back contacts for a photovoltaic cell device is disclosed. The device comprises a wafer having a back surface, one or more emitter regions, one or more emitter contacts, and one or more base contacts. The process comprises the steps of depositing a passivation layer on the back surface of the wafer, inkjetting a resist on the passivation layer in a pattern corresponding to a boundary between the one or more emitter contacts and the one or more base contacts, depositing an n-type or p-type emitter layer on the passivation layer to form the one or more emitter regions, depositing a metal layer on the emitter layer and the resist, laser firing selected areas of the metal layer to form the one or more base contacts, and laser cutting the metal layer over the resist to create at least one isolation region between the one or more emitter contacts and the one or more base contacts.

In accordance with still another aspect of the present invention, a process for fabricating back contacts for a photovoltaic cell device is disclosed. The device comprises a wafer having a back surface, one or more emitter regions, one or more base regions, one or more emitter contacts, and one or more base contacts. The process comprises the steps of depositing a passivation layer on the back surface of the wafer, inkjetting a first resist on a portion of the passivation layer in a pattern defining the one or more emitter regions, depositing an emitter layer on the passivation layer and the first resist, removing the first resist to form the one or more emitter regions, inkjetting a second resist on a portion of the passivation layer and the one or more emitter regions in a pattern corresponding to the one or more base regions, depositing a base layer on the passivation layer and the second resist, removing the second resist to form the one or more base regions, inkjetting the one or more emitter contacts on the one or more emitter regions, and inkjetting the one or more base contacts on the one or more base regions a metal layer on the emitter layer and the resist.

BRIEF DESCRIPTION OF THE DRAWINGS

The invention is best understood from the following detailed description when read in connection with the accompanying drawings, with like elements having the same reference numerals. Accordingly to common practice, the various features of the drawings are not drawn to scale unless otherwise indicated. On the contrary, the dimensions of the various features may be expanded or reduced for clarity. Included in the drawings are the following figures.

DETAILED DESCRIPTION OF THE INVENTION

The exemplary processes described herein may be particularly suitable for fabricating all-back-contact heterojunction photovoltaic cell devices. As used herein, "photovoltaic cell devices" refer to any devices that operate based on the photovoltaic effect, including, for example, solar cells and photodetectors. As used herein, "all-back-contact" refers to a photovoltaic cell device having an emitter region and emitter and base contacts on only its rear surface. In particular, both emitter contacts and base contacts are formed on the device's rear surface. Additionally, as used herein, "heterojunction" refers to a photovoltaic cell device including a boundary between two different materials, i.e., between a main wafer and an emitter layer. While the below examples describe heterojunction photovoltaic cell devices formed from crystalline silicon and amorphous silicon, it will be understood that other materials may be used. Suitable all-back-contact heterojunction photovoltaic cell devices for fabrication using the exemplary processes described herein will be known to one of ordinary skill in the art from the description herein.

The exemplary processes described herein utilize laser and/or inkjet technologies to pattern the back contacts for photovoltaic cell devices. These technologies may allow precise control over the location of the materials deposited, thereby reducing costs of fabrication and increasing throughput. Additionally, the disclosed processes may be performed at wafer temperatures below 300° C., thereby reducing costs, increasing throughput, and limiting damage to the photovoltaic cell materials, e.g. c-Si wafers. This low processing temperature may be especially valuable when using thin c-Si wafers (e.g., <150 μm).

Figure 1:
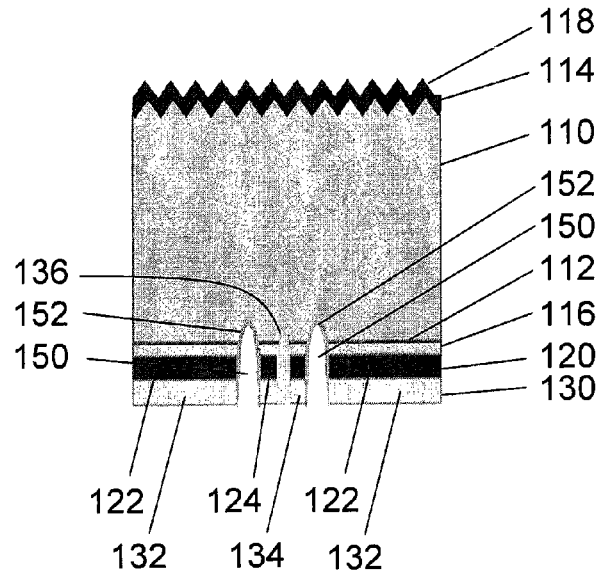
FIG. 1 is a diagram cross-sectional view of an exemplary photovoltaic cell device in accordance with aspects of the present invention.

Referring now to the drawings, FIG. 1 illustrates an exemplary photovoltaic cell device 100 in accordance with aspects of the present invention. Photovoltaic cell device 100 is an all-back-contact heterojunction photovoltaic cell. As a general overview, photovoltaic cell device 100 includes a wafer 110, an emitter layer 120, one or more emitter contacts 132, and one or more base contacts 134. Additional details of photovoltaic cell device 100 are described below.

Wafer 110 is a semiconductor wafer. In an exemplary embodiment, wafer 110 is an n-type or p-type crystalline silicon (c-Si) wafer. Wafer 110 has a back surface 112 and a front surface 114. Wafer 110 may be approximately 10-400 μm thick from the back surface 112 to the front surface 114. However, it will be understood that above materials and thicknesses for wafer 110 are exemplary, and that other materials and/or thicknesses may be selected, as would be understood by one of ordinary skill in the art from the description herein. The front surface 114 of wafer 110 may desirably be roughened or otherwise textured to promote internal scattering and light trapping, which results in relatively higher photocurrents and efficiency.

A passivation layer 118 may be formed on the front surface 114 of wafer 110. Passivation layer 118 may be combined with an antireflection layer. Suitable materials for passivation layer 118 include for example, amorphous silicon (a-Si), amorphous silicon-oxide (a-SiO), amorphous silicon-nitride (a-SiN), amorphous silicon-carbide (a-SiC), or aluminum oxide ($Al_2O_3$). Other suitable materials for passivation layer 118 will be understood by one of ordinary skill in the art from the description herein.

A second passivation layer 116 is formed on the back surface 112 of wafer 110. The passivation layer 116 may cover substantially the entire back surface 112 of wafer 110, with the exception of isolation regions 150 (described below). In an exemplary embodiment, the passivation layer 116 comprises an intrinsic amorphous silicon (a-Si) layer. Passivation layer 116 may be approximately 5 nm thick. However, it will be understood that above materials and thicknesses for passivation layer 116 are exemplary, and that other materials and/or thicknesses may be selected, as would be understood by one of ordinary skill in the art from the description herein.

Emitter layer 120 is formed on the back surface of passivation layer 116. The emitter layer 120 may cover substantially the entire back surface of passivation layer 116, with the exception of isolation regions 150 (described below). Emitter layer 120 includes a plurality of functional emitter regions 122 and non-functional emitter regions 124. However, it will be understood that emitter layer 120 may include any number of functional emitter regions 122 and non-functional emitter regions 124. Further, non-functional emitter region 124 may be omitted from emitter layer 120. Emitter regions 122 and 124 are formed in parallel strips on the back surface of the passivation layer 116. Alternatively, emitter regions 122 and 124 may be formed as circular shapes on the back surface of passivation layer 116. Other shapes for emitter regions 122 and 124 may be selected, as would be understood by one of ordinary skill in the art from the description herein.

In an exemplary embodiment, emitter layer 120 comprises a layer of n-doped or p-doped amorphous silicon. The dopant for emitter layer 120 is selected so as to be opposite of the conductivity type (n-type or p-type) of wafer 110.

Metal layer 130 is formed on the back surface of emitter layer 120. Metal layer 130 includes a plurality of emitter contacts 132 and a base contact 134. Emitter contacts 132 may cover substantially the entire back surface of functional emitter regions 122. In an exemplary embodiment, emitter contacts 132 comprise layers of conductive metal. Emitter contacts 132 may be approximately 500 nm thick.

Base contact 134 comprises a metal layer portion formed on the back surface of non-functional emitter region 124. The metal layer portion of base contact 134 may cover substantially the entire back surface of non-functional emitter region 124. In an exemplary embodiment, when non-functional emitter region 124 is included in device 100, base contact 134 will further comprise a laser-fired region 136 connected with the metal layer portion of base contact 134. Laser-fired region 136 comprises an area of metal particles extending from the metal layer portion of base contact 134 toward the front surface 114 of wafer 110. Laser-fired region 136 extends from the metal layer portion of base contact 134 through non-functional emitter region 124 and passivation layer 116 to wafer 110, in order to form an ohmic contact between the metal layer portion of base contact 134 and wafer 110. It is contemplated that the ohmic contact is formed by the diffusion of metal particles from the metal layer portion of base contact 134 through the non-functional emitter region 124 during laser firing. Laser-fired region 136 may extend linearly along the length of base contact 134 and non-functional emitter region 124, i.e., into or out of the page in FIG. 1. Alternatively, laser-fired region 136 may comprise a plurality of laser-fired points spaced along the length of base contact 134 and non-functional emitter region 124.

The type of metal used for metal layer 130 may be selected based on the doping of wafer 110 to provide an ohmic contact. Suitable metals for use as metal layer 130 include, for example, aluminum, silver, titanium, antimony, or palladium. However, it will be understood that above thickness and materials for metal layer 130 are exemplary, and that other materials and/or thicknesses may be selected, as would be understood by one of ordinary skill in the art from the description herein.

Photovoltaic cell device 100 further includes isolation regions 150. Isolations regions 150 are formed at the boundary of each emitter contact 132 with each base contact 134. In an exemplary embodiment, isolations regions 150 comprise areas where material has been removed, e.g., channels formed in the layers of photovoltaic cell device 100. Isolation regions 150 isolate the emitter contacts 132 from the base contacts 134. Isolation regions 150 extend along substantially the entire length of emitter and base contacts 132 and 134. As illustrated in FIG. 1, isolation regions 150 may also extend through emitter layer 120 to expose wafer 110.

Each isolation region 150 includes a passivation layer 152. Passivation layers 152 re-passivate wafer 110 after portions of passivation layer 116 are removed when isolation regions 150 are formed. Passivation layers 152 covers substantially the entire surface area of isolation regions 150. In an exemplary embodiment, the passivation layer 152 comprises a layer of silicon oxide (SiO). Passivation layer 152 may be approximately 5 nm thick. However, it will be understood that above materials and thicknesses for passivation layer 116 are exemplary, and that other materials and/or thicknesses may be selected, as would be understood by one of ordinary skill in the art from the description herein.

Emitter contacts 132 and base contacts 134 are electrically isolated from one another on a photovoltaic cell device 100, but are connected in series with adjacent photovoltaic cell devices 100 (not shown) to comprise a photovoltaic module. The photovoltaic module may be formed by connecting the emitter contacts 132 on one photovoltaic cell device 100 are connected to the base contacts 134 on an adjacent photovoltaic cell device. Photovoltaic modules may be used like batteries to power one or more electronic devices, as would be understood by one of ordinary skill in the art from the description herein.

Figure 2:
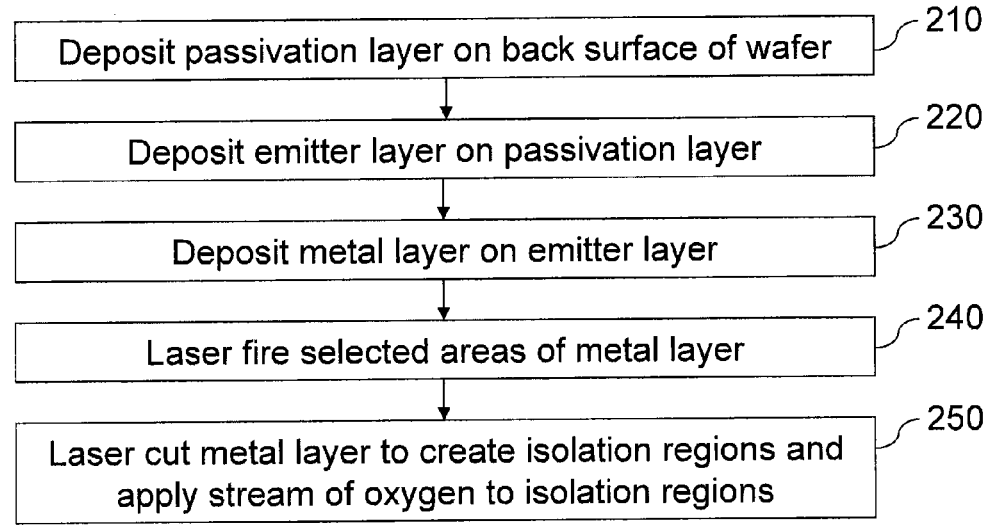
FIG. 2 is a flowchart of an exemplary process for fabricating back contacts for a photovoltaic cell device in accordance with aspects of the present invention.

FIG. 2 illustrates an exemplary process 200 for fabricating back contacts for a photovoltaic cell device. The photovoltaic cell device comprises a wafer, an emitter layer, one or more emitter contacts, and one or more base contacts. To facilitate description, the steps of process 200 will be described herein with respect to components of photovoltaic cell device 100. As a general overview, process 200 includes depositing a passivation layer, depositing an emitter layer, depositing a metal layer, laser firing the metal layer, laser cutting the metal layer, and applying a stream of reactive gas. Additional details of process 200 are described below.

In step 210, a passivation layer is deposited on the back surface of the wafer. In an exemplary embodiment, passivation layer 116 is deposited on the back surface 112 of wafer 110. Passivation layer 116 may be deposited on substantially the entire back surface 112 of wafer 110. Passivation layer 116 may be deposited, for example, by chemical vapor deposition.

In step 220, an emitter layer is deposited on the passivation layer. In an exemplary embodiment, emitter layer 120 is deposited on the back surface of passivation layer 116. Emitter layer 120 may be deposited on substantially the entire back surface of passivation layer 116. Emitter layer 120 may be deposited, for example, by chemical vapor deposition.

As set forth above, emitter layer 120 comprises one or more functional emitter regions 122, and one or more non-functional emitter regions 124. Optionally, non-functional emitter regions 124 may be omitted from emitter layer 120. Functional emitter regions 122 and non-functional emitter regions 124 may be formed in shapes such as, for example, parallel strips or circles, as described above with respect to photovoltaic cell device 100.

In step 230, a metal layer is deposited on the emitter layer. In an exemplary embodiment, metal layer 130 is deposited on the back surface of emitter layer 120. The metal layer may be deposited on substantially the entire back surface of emitter layer 120. The metal layer comprises one or more emitter contacts 132 in areas corresponding to the one or more functional emitter regions 122, and one or more base contacts 134 in areas corresponding to the one or more non-functional emitter regions 124.

Metal layer 130 may be deposited in multiple stages, to facilitate the laser firing step described below. For example, it may be desirable to deposit a first thin metal layer, in order to facilitate laser firing of metal particles. Following the laser firing step, a second, thicker metal layer may be deposited to improve contact resistance. The metal layer or layers may be deposited, for example, by physical vapor deposition.

In step 240, selected areas of the metal layer are laser fired. In an exemplary embodiment, the metal layer is laser fired in areas corresponding to the one or more base contacts 134. It is contemplated that the laser heats the metal layer and the non-functional emitter regions 124 of the emitter layer 120 such that particles of metal from the metal layer 130 diffuse through the non-functional emitter region 124 of the emitter layer 120, thereby creating the laser-fired region 136 of base contact 134. The metal layer may be laser fired to create a linear laser-fired region extending along the length of base contact 134, or to create a plurality of laser-fired points spaced along the length of base contact 134. A suitable laser for laser firing the metal region includes, for example, a laser comprising Nd-YAG or Nd-YVO4 at either 532 or 1064 nm wavelengths. The laser may be operated in a pulsed mode at between 0.1 and 100 kHz at a power between 0.1 and 5 Watts in order to laser fire the selected areas of metal layer 130.

In step 250, the metal layer is laser cut. In an exemplary embodiment, the metal layer is laser cut to pattern the metal layer and create isolation regions 150 between the one or more emitter contacts 132 and the one or more base contacts 134. The laser ablates portions of the metal layer and emitter layer 120 along the boundary to isolate the emitter contacts 132 from the base contacts 134. The laser ablation creates isolation regions 150, which may extend all the way through emitter layer 120 and passivation layer 116, thereby exposing or damaging wafer 110. Isolation regions 150 are created at the boundary of each emitter contact 132 with each base contact 134, and extend along substantially the entire length of emitter and base contacts 132 and 134. Suitable laser for laser cutting the metal layer includes the laser(s) described above in step 240. It may be necessary to operate the laser at higher power relative to the laser firing step in order to perform the laser cutting step.

During step 250, a stream of a reactive gas is applied to the isolation regions. The reactive gas may be selected to be a gas that will react with the laser-heated wafer to form a passivation layer. Suitable gases include, for example, $O_2$, $O_3$, $CO_2$, $NH_3$, NO, or dry air. In an exemplary embodiment, a stream of oxygen is applied to isolation regions 150 to form passivation layer 152 while laser cutting the metal layer. The oxygen combines with the laser-heated silicon trench to create a layer of silicon oxide (SiO) that forms passivation layer 152. Passivation layers 152 may be formed to cover substantially the entire surface area of isolation regions 150. The stream of oxygen may be applied, for example, via an air jet. Further, the type of oxygen applied (e.g., $O_2$ or $O_3$), may be selected in order to optimize the formation of passivation layer 152.

It will be understood that process 200 is not limited to the above-described steps. Additional steps may be included, as would be understood by one of ordinary skill in the art from the description herein.

For example, the metal layer may be electrically connected with one or more adjacent photovoltaic cell devices to form a photovoltaic module. Conventional metal interconnects may be formed for electrically connecting emitter contacts 132 and base contacts 134 in series (i.e., emitter contact of one cell to base contact of another cell) in order to form photovoltaic modules, as would be understood by one of ordinary skill in the art.

Figure 3:
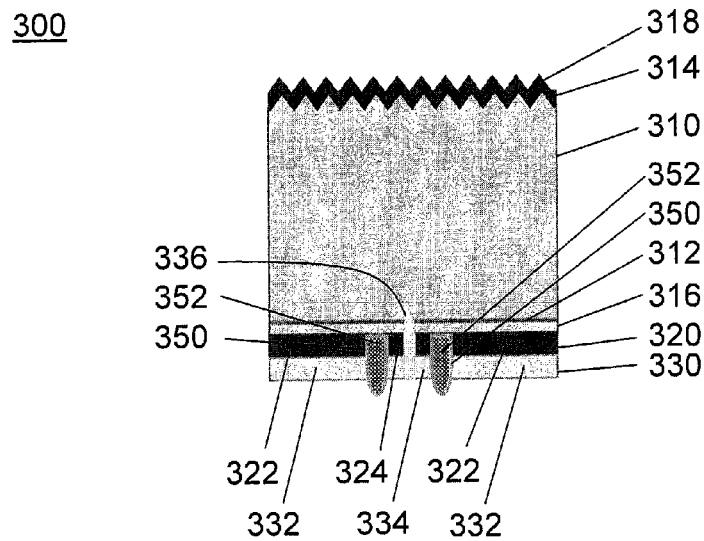
FIG. 3 is a diagram cross-sectional view of another exemplary photovoltaic cell device in accordance with aspects of the present invention.

FIG. 3 illustrates another exemplary photovoltaic cell device 300 in accordance with aspects of the present invention. Photovoltaic cell device 300 is an all-back-contact heterojunction photovoltaic cell. As a general overview, photovoltaic cell device 100 includes a wafer 310, an emitter layer 320, one or more emitter contacts 332, and one or more base contacts 334. Photovoltaic cell device 300 is substantially the same as photovoltaic cell device 100, except as described below.

Wafer 310 is a semiconductor wafer having a back surface 312 and a front surface 314. A passivation layer 316 is formed on the back surface 312 of wafer 310. Another passivation layer 318 may be formed on the front surface 314 of wafer 110.

Emitter layer 320 is formed on the back surface of passivation layer 316. Emitter layer 320 includes a plurality of functional emitter regions 322 and a non-functional emitter region 324. A metal layer 330 including emitter contacts 332 and base contacts 334 is formed on the back surface of emitter layer 320. Emitter contacts 332 are formed on the back surface of functional emitter regions 322, and base contact 334 is formed on the back surface of non-functional emitter region 324. Base contact 334 includes a laser-fired region 336.

Isolation regions 350 are formed to define the boundary between each emitter contact 332 with each base contact 334. In an exemplary embodiment, isolation regions 350 comprise a resist layer 352. Resist layer 352 is patterned on passivation layer 316 (e.g., by inkjetting) in an area corresponding to the boundary between emitter contacts 332 and base contacts 334. Resist layer 352 isolates the emitter contacts 332 from the base contacts 334. Resist layer 352 extends along substantially the entire length of the boundary between emitter and base contacts 332 and 334.

In an exemplary embodiment, resist layer 352 comprises a polymer ink. Suitable polymers for use as resist layer 352 will be understood by one of ordinary skill in the art from the description herein.

Figure 4:
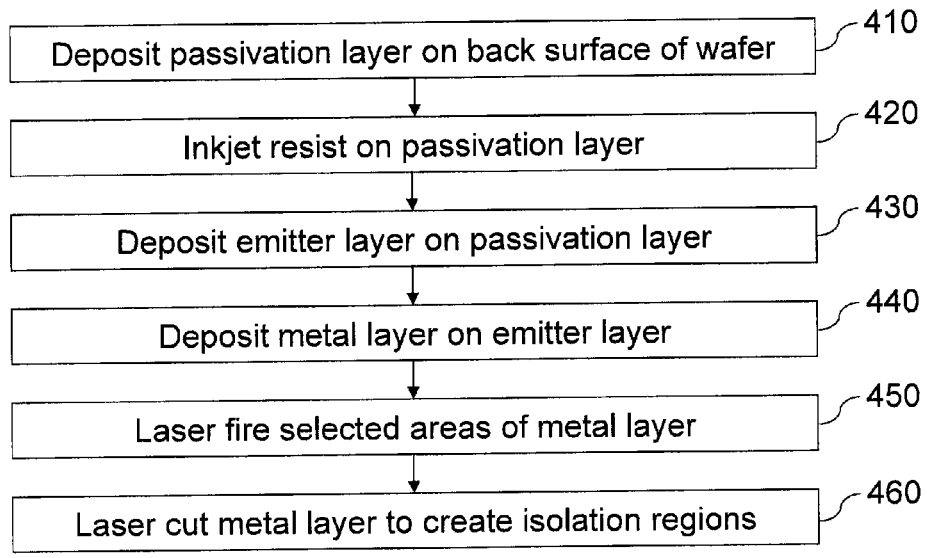
FIG. 4 is a flowchart of another exemplary process for fabricating back contacts for a photovoltaic cell device in accordance with aspects of the present invention.

FIG. 4 illustrates another exemplary process 400 for fabricating back contacts for a photovoltaic cell device. The photovoltaic cell device comprises a wafer, an emitter layer, one or more emitter contacts, and one or more base contacts. To facilitate description, the steps of process 400 will be described herein with respect to components of photovoltaic cell device 300. As a general overview, process 400 includes depositing a passivation layer, inkjetting a resist, depositing an emitter layer, depositing a metal layer, laser firing the metal layer, and laser cutting the metal layer. Process 400 is substantially the same as process 200, except as described below.

In step 410, a passivation layer is deposited on the back surface of the wafer. In an exemplary embodiment, passivation layer 316 is deposited on the back surface 312 of wafer 310. Passivation layer 316 may be deposited, for example, by chemical vapor deposition.

In step 420, a resist is inkjetted on the passivation layer. In an exemplary embodiment, resist 352 is inkjetted on passivation layer 316 in a pattern corresponding to the desired boundary between the emitter contacts 332 and base contacts 334. Hardening substances, such as plasticizers, may be used to harden resist layer 352. Resist 352 extends along substantially the entire length of the boundary between emitter and base contacts 332 and 334. Resist 352 comprises a polymer ink. Suitable inkjets for applying resist 352 will be known to one of ordinary skill in the art from the description herein. Inkjetting resist 352 may be particular desirable, as it offers high resolution and control in applying resist 352.

In step 430, an emitter layer is deposited on the passivation layer. In an exemplary embodiment, emitter layer 320 is deposited on the back surface of passivation layer 316 over resist 352. Emitter layer 320 may be deposited, for example, by chemical vapor deposition.

In step 440, a metal layer is deposited on the emitter layer and the resist. In an exemplary embodiment, metal layer 330 is deposited on the back surface of emitter layer 320 and on resist 352. The metal layer 330 may be deposited, for example, by physical vapor deposition. Metal layer 230 may be deposited in multiple stages, as described above with respect to step 230.

In step 450, selected areas of the metal layer are laser fired. In an exemplary embodiment, the metal layer is laser fired in areas corresponding to the one or more base contacts 334. It is contemplated that the laser causes particles of metal from the metal layer 330 to diffuse through the non-functional emitter region 324 of the emitter layer 320, creating the laser-fired region 336.

In step 460, the metal layer is laser cut. In an exemplary embodiment, the metal layer 330 is laser cut along resist 352 to create isolation regions 350 between the one or more emitter contacts 332 and the one or more base contacts 334. The laser ablates portions of the metal layer and emitter layer 320 to isolate the emitter contacts 332 from the base contacts 334. However, the laser does not ablate the material of resist 352. Resist 352 acts as a laser stop, preventing the laser from cutting any portion of wafer 310 or passivation layer 316 beneath resist 352.

It will be understood that process 400 is not limited to the above-described steps. Additional steps may be included, as would be understood by one of ordinary skill in the art from the description herein.

Figure 5:
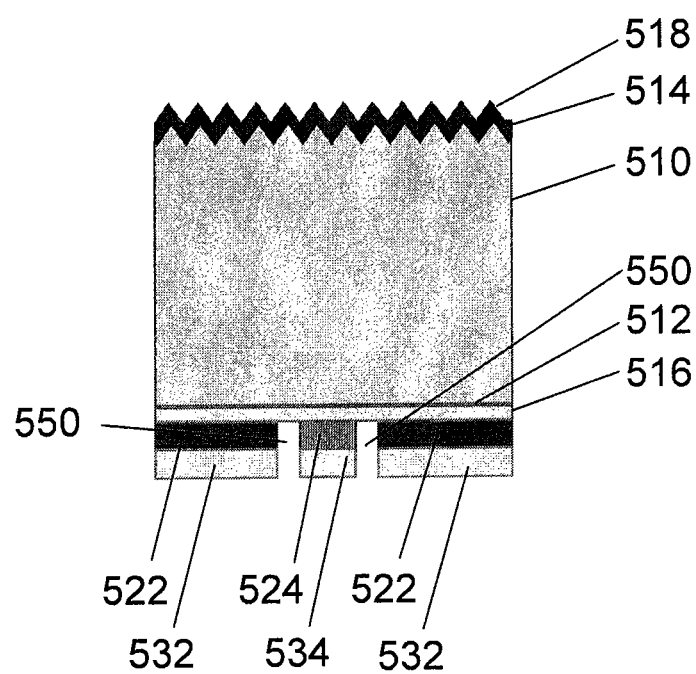
FIG. 5 is a diagram cross-sectional view of another exemplary photovoltaic cell device in accordance with aspects of the present invention.

FIG. 5 illustrates another exemplary photovoltaic cell device 500 in accordance with aspects of the present invention. Photovoltaic cell device 500 is an all-back-contact heterojunction photovoltaic cell. As a general overview, photovoltaic cell device 500 includes a wafer 510, one or more emitter regions 522, one or more base regions 524, one or more emitter contacts 532, and one or more base contacts 534. Photovoltaic cell device 500 is substantially the same as photovoltaic cell device 500, except as described below.

Wafer 510 is a semiconductor wafer having a back surface 512 and a front surface 514. A passivation layer 516 is formed on the back surface 512 of wafer 510. Another passivation layer 518 may be formed on the front surface 514 of wafer 510.

Emitter regions 522 and base region 524 are formed on the back surface of passivation layer 516. Emitter contacts 532 are formed on the back surface of emitter regions 522, and base contact 534 is formed on the back surface of base region 524.

Isolations regions 550 are formed to define the boundary between each emitter contact 532 with each base contact 534. In an exemplary embodiment, isolation regions 550 comprise channels formed in the layers of photovoltaic cell device 500. Isolation regions 550 isolate the emitter contacts 532 from the base contacts 534. Isolation regions 550 extend along substantially the entire length of the boundary between emitter and base contacts 532 and 534.

Figure 6:
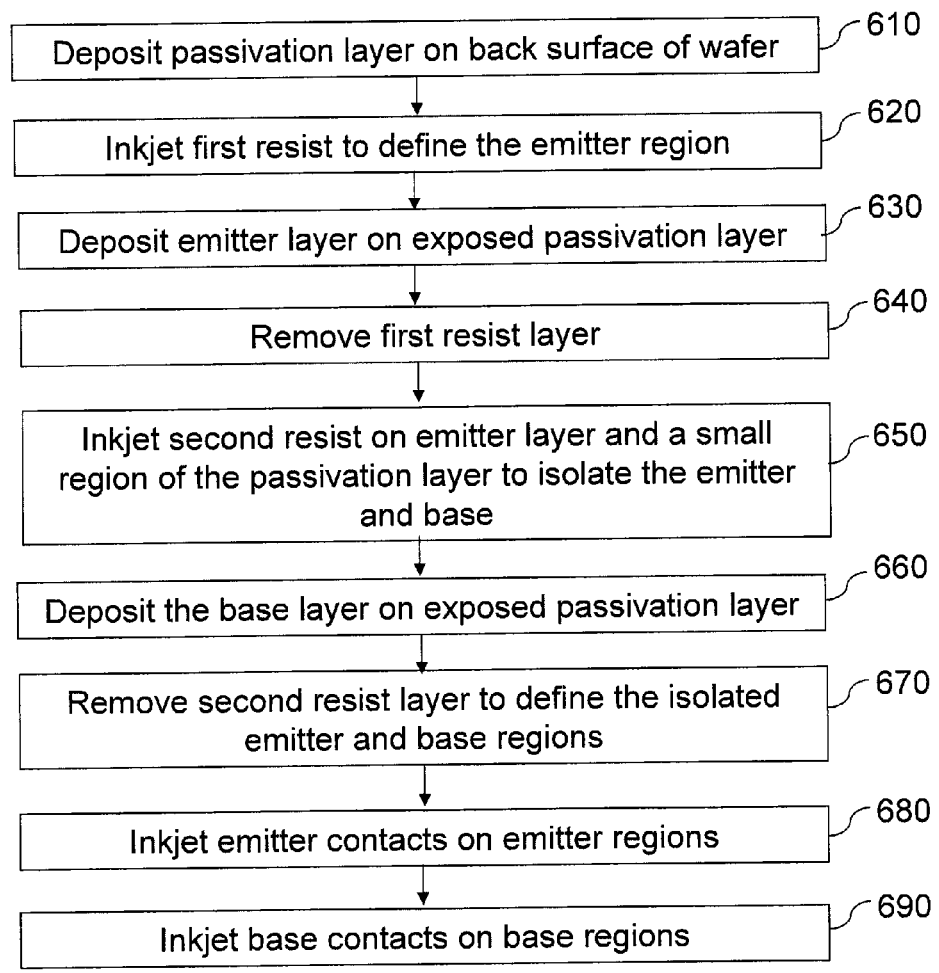
FIG. 6 is a flowchart of another exemplary process for fabricating back contacts for a photovoltaic cell device in accordance with aspects of the present invention.

FIG. 6 illustrates another exemplary process 600 for fabricating back contacts for a photovoltaic cell device. The photovoltaic cell device comprises a wafer, one or more emitter regions, one or more base regions, one or more emitter contacts, and one or more base contacts. To facilitate description, the steps of process 600 will be described herein with respect to components of photovoltaic cell device 500. As a general overview, process 600 includes depositing a passivation layer, inkjetting a first resist, depositing an emitter layer, removing the first resist, inkjetting a second resist, depositing a base layer, removing the second resist, inkjetting one or more emitter contacts, and inkjetting one or more base contacts. Additional details of process 600 are described below.

In step 610, a passivation layer is deposited on the back surface of the wafer. In an exemplary embodiment, passivation layer 516 is deposited on the back surface 512 of wafer 510. Passivation layer 516 may be deposited, for example, by chemical vapor deposition.

In step 620, a first resist is inkjetted on the passivation layer. In an exemplary embodiment, a first resist is inkjetted on the passivation layer in a pattern defining the one or more emitter regions 522. Hardening substances, such as plasticizers, may be used to harden the first resist. The first resist may be, for example, a photoresist. Suitable photoresists will be known to one of ordinary skill in the art from the description herein. After the resist is applied, the resist may be cured to provide a barrier to the subsequent etching steps, as would be understood by one of ordinary skill in the art from the description herein.

In step 630, an emitter layer is deposited on the passivation layer. In an exemplary embodiment, an emitter layer is deposited on the back surface of passivation layer 516. The emitter layer may be deposited, for example, by chemical vapor deposition. Generally, a portion of the emitter layer will be formed on the passivation later 516, and a portion of the emitter layer will be formed on the first resist.

In step 640, the first resist is removed. In an exemplary embodiment, the first resist is dissolved to remove the resist and the portions of the emitter layer formed on top of the first resist. A suitable solvent will be known to one of ordinary skill in the art based on the resist used. The first resist and corresponding portions of the emitter layer are removed such that the only portions of the emitter layer remaining are in the areas corresponding to the one or more emitter regions 522.

In step 650, a second resist is inkjetted on the emitter layer. In an exemplary embodiment, a second resist is inkjetted on the emitter layer and a small portion of the passivation layer in a pattern defining the one or more base regions 524, substantially as described above in step 620.

In step 660, a base layer is deposited on the passivation layer. In an exemplary embodiment, a base layer is deposited on the back surface of passivation layer 516. Generally, a portion of the emitter layer will be formed on the passivation later 516, and a portion of the emitter layer will be formed on the second resist, substantially as described in step 630.

In step 670, the second resist is removed. In an exemplary embodiment, the second resist is dissolved to remove the resist and the portions of the base layer formed on top of the first resist. The second resist and corresponding portions of the base layer are removed such that the only portions of the base layer remaining are in the areas corresponding to the one or more base regions 524, substantially as described above in step 640.

In step 680, emitter contacts are inkjetted on the emitter regions. In an exemplary embodiment, one or more emitter contacts 532 are inkjetted on the one or more emitter regions 522. The one or more emitter contacts 532 may be deposited on substantially the entire back surface of emitter regions 522. Emitter contacts 532 may comprise conductive inks such as, for example, copper or silver ink. Suitable inkjets for applying the emitter contacts include those inkjets described above with respect to step 630.

In step 690, base contacts are inkjetted on the base regions. In an exemplary embodiment, one or more base contacts 534 are inkjetted on the one or more base regions 524, substantially as described above in step 680.

It will be understood that process 600 is not limited to the above-described steps. Additional steps may be included, as would be understood by one of ordinary skill in the art from the description herein.

The exemplary processes disclosed herein provide advantages over conventional processes, as set forth below.

Conventional processes employ a multi-step photolithography process consisting of a-Si and metal depositions and etching in order to form the back contacts for a photovoltaic cell device. This requires three chemical vapor depositions (CVDs), two photolithography steps, two wet resist removals and two metal contact depositions.

In the process described herein, the photolithography and vacuum deposited contacts are eliminated in favor of laser and/or inkjet technologies to pattern the back emitter and contacts. Using these technologies minimizes the number of CVD steps, and may allow for relatively high efficiency and low cost in fabricating photovoltaic cell devices, as compared with conventional photolithographic processes. Additionally, the disclosed processes may be performed at wafer temperatures below 300° C. Fabricating back contacts at temperatures below 300° C. may reduce costs, increase throughput, and limit damage to the photovoltaic cell materials, e.g. c-Si wafers. The final result is a high speed, low temperature, and low cost manufacturing process for the all-back-contact heterojunction photovoltaic cell devices that can be efficiently incorporated into photovoltaic module.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A process for fabricating back contacts for a photovoltaic cell device, the device comprising a wafer having a back surface, one or more emitter regions, one or more emitter contacts, and one or more base contacts, the process comprising the steps of:

depositing a first passivation layer on the back surface of the wafer;

depositing an n-type or p-type emitter layer on the passivation layer, the emitter layer comprising the one or more emitter regions;

depositing a metal layer on the emitter layer;

laser firing selected areas of the metal layer to form the one or more base contacts;

laser cutting the metal layer to pattern the metal layer and create at least one isolation region between the one or more emitter contacts and the one or more base contacts; and applying a stream of reactive gas to form a second passivation layer in the isolation region while laser cutting the metal layer.

2. The process of claim 1, wherein the step of depositing the emitter layer comprises depositing the emitter layer using chemical vapor deposition.

3. The process of claim 1, wherein the step of depositing the metal layer on the emitter layer comprises depositing the metal layer by physical vapor deposition.

4. The process of claim 1, wherein the step of laser firing comprises laser firing selected areas of the metal layer to create a laser-fired region extending from the metal layer to the wafer.

5. The process of claim 1, wherein the wafer comprises crystalline silicon, the first passivation layer comprises an intrinsic layer of amorphous silicon, and the emitter layer comprises n-doped or p-doped amorphous silicon.

6. A process for fabricating back contacts for a photovoltaic cell device, the device comprising a wafer having a back surface, one or more emitter regions, one or more emitter contacts, and one or more base contacts, the process comprising the steps of:
- depositing a passivation layer on the back surface of the wafer;
- inkjetting a resist on the passivation layer in a pattern corresponding to a boundary between the one or more emitter contacts and the one or more base contacts;
- depositing an n-type or p-type emitter layer on the passivation layer to form the one or more emitter regions;
- depositing a metal layer on the emitter layer and the resist;
- laser firing selected areas of the metal layer to form the one or more base contacts; and
- laser cutting the metal layer over the resist to create at least one isolation region between the one or more emitter contacts and the one or more base contacts.

7. The process of claim 6, wherein the step of depositing the emitter layer comprises depositing the emitter layer using chemical vapor deposition.

8. The process of claim 6, wherein the step of depositing the metal layer on the emitter layer comprises depositing the metal layer by physical vapor deposition.

9. The process of claim 6, wherein the step of laser firing comprises laser firing selected areas of the metal layer to create a laser-fired region extending from the metal layer to the wafer.

10. The process of claim 6, wherein the wafer comprises crystalline silicon, the first passivation layer comprises an intrinsic layer of amorphous silicon, and the emitter layer comprises n-doped or p-doped amorphous silicon.

11. A process for fabricating back contacts for a photovoltaic cell device, the device comprising a wafer having a back surface, one or more emitter regions, one or more base regions, one or more emitter contacts, and one or more base contacts, the process comprising the steps of:
- depositing a passivation layer on the back surface of the wafer;
- inkjetting a first resist on a portion of the passivation layer in a pattern defining the one or more emitter regions;
- depositing an emitter layer on the passivation layer and the first resist;
- removing the first resist to form the one or more emitter regions;
- inkjetting a second resist on a portion of the passivation layer and the one or more emitter regions in a pattern corresponding to the one or more base regions;
- depositing a base layer on the passivation layer and the second resist;
- removing the second resist to form the one or more base regions;
- inkjetting the one or more emitter contacts on the one or more emitter regions; and
- inkjetting the one or more base contacts on the one or more base regions.

* * * * *